United States Patent
Fan

(10) Patent No.: US 8,053,676 B2
(45) Date of Patent: Nov. 8, 2011

(54) SUBSTRATE PANEL HAVING A PLURALITY OF SUBSTRATE STRIPS FOR SEMICONDUCTOR PACKAGES

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 659 days.

(21) Appl. No.: 12/191,645

(22) Filed: Aug. 14, 2008

(65) Prior Publication Data
US 2010/0038118 A1    Feb. 18, 2010

(51) Int. Cl.
*H05K 1/03*    (2006.01)
*H05K 7/00*    (2006.01)

(52) U.S. Cl. .......................... 174/255; 174/254; 361/777
(58) Field of Classification Search .......... 174/250–687; 361/748–803
See application file for complete search history.

(56) References Cited

U.S. PATENT DOCUMENTS

| | | | |
|---|---|---|---|
| 7,284,224 B2 * | 10/2007 | Wang et al. | 174/261 |
| 7,919,715 B2 * | 4/2011 | Fan | 174/261 |
| 2009/0139746 A1 * | 6/2009 | Yoon et al. | 174/250 |
| 2009/0139747 A1 * | 6/2009 | Yoon et al. | 174/250 |
| 2009/0223435 A1 * | 9/2009 | Fan et al. | 116/240 |
| 2009/0224395 A1 * | 9/2009 | Fan | 257/691 |

* cited by examiner

*Primary Examiner* — Zachary M Pape
(74) *Attorney, Agent, or Firm* — Muncy, Geissler, Olds & Lowe, PLLC

(57) ABSTRACT

A substrate panel primarily comprises a plurality of substrate strips arranged in an array, one or more current input lines, a plurality of cascaded lines connecting between the substrate strips, and a current input buffer gate. Current input lines connect a current input side of the substrate panel to the adjacent substrate strips. The current input buffer gate has a frame around the substrate strips and a plurality of meshes where the frame intersects with the current input lines and the meshes intersect with the cascaded lines with both ends of the meshes connecting to the frame. Therefore, the current can be evenly distributed to each substrate strip during plating processes to improve the issues of different plating thicknesses and different plating roughness caused by different current densities and to protect the internal circuits inside the substrate strips from the damages due to current surges and unstable voltages.

14 Claims, 4 Drawing Sheets

SUBSTRATE PANEL HAVING A PLURALITY OF SUBSTRATE STRIPS FOR SEMICONDUCTOR PACKAGES

FIELD OF THE INVENTION

The present invention relates to a printed circuit board, and more particularly to a substrate panel including a plurality of substrate strips for semiconductor packages.

BACKGROUND OF THE INVENTION

Printed circuit boards have been implemented as micro substrates or substrate units for carrying chips in semiconductor packages. A plurality of micro substrates are arranged in an array and disposed on a substrate strip where the semiconductor packages are assembled on the substrate strip. Furthermore, a plurality of substrate strips are arranged on a substrate panel for mass production by the processes of printed circuit boards. Normally, before the singulation of a substrate strip, nickel/gold or other metals are electroplated on the metal pads on the substrate panel to prevent metal oxidation and to enhance metal bonding strengths in the following processes such as wire bonding or solder ball placement.

As shown in FIG. 1, a conventional substrate panel 100 comprises a plurality of substrate strips 110, a plurality of current input lines 121 and current output lines 122 at opposing sides, and a plurality of cascaded lines 130 where the lines 121 and 122 and the cascaded lines 130 are copper traces formed from the same metal layer. The substrate strips 110 are connected to each other as one body and are disposed in an array on the substrate panel 100 where some of the substrate strips 110 adjacent to the current input side 101 of the substrate panel 100 are numbered as 110A. The current input lines 121 connect from the current input side 101 of the substrate panel 100 to the adjacent substrate strips 110A, the current output lines 122 from the current output side 102 of the substrate panel 100 to the adjacent substrate strips 110. Two adjacent substrate strips 110 are connected by the cascaded lines 130. During plating processes, current flows from the current input side 101 to the substrate strip 110A through the current input lines 121, then flows to the adjacent substrate strips 110 through the cascaded lines 130, and finally flows to the current output side 102 through the current output lines 122 where the direction of the current flow is shown in the arrows in FIG. 1. Since the current flows to the substrate strip 110A first and then flows to other substrate strips 110, the substrate strips 110A experience the highest current density, then the current density will gradually decrease toward the current output side 102 as the distance of the substrate strips 110 from the current input side 101 increases causing different current densities at different substrate strips 110 at different locations of the substrate panel 100 leading to poor plating qualities such as different plated thicknesses and different plated roughness. Moreover, poor plating qualities will cause wire-bonding failure or poor solder ball jointing strengths during semiconductor packaging processes. Furthermore, when there are current surges or unstable voltages, the adjacent substrate strips 110A to the current input side 101 will be damaged by the surges through the current input lines 121.

SUMMARY OF THE INVENTION

The main purpose of the present invention is to provide a substrate panel by using a current input buffer gate to evenly distribute the current density to each substrate strip during plating processes to improve the plating issues of different plating thicknesses and different roughness due to uneven current densities.

According to the present invention, a substrate panel is revealed, primarily comprising a plurality of substrate strips, one or more current input lines, a plurality of cascaded lines, and a current input buffer gate. The substrate strips are arranged in an array on the substrate panel. Each substrate strip includes a plurality of substrate units arranged in an array. The current input lines connect from one side of the substrate panel to the adjacent substrate strips. The cascaded lines connect between the substrate strips. The current input buffer gate is disposed on the substrate panel expect the substrate strips and has a frame and a plurality of meshes. The frame is formed on the peripheries of one surface of the substrate panel and intersects with the current input lines. The meshes are formed inside the frame and located between the substrate strips to intersect with the cascaded lines with both ends of the meshes connected to the frame.

The substrate panel revealed according to the present invention has the following advantages and functions:

1. By using the current input buffer gate to intersect with the current input lines and cascaded lines, the current density can be evenly distributed to each substrate strip during plating processes to avoid different plating thicknesses and different plating roughness due to different current densities and to protect internal circuits inside the substrate strips from the damages caused by current surges and unstable voltages.

2. By disposing a plurality of plating distributed lines between the frame and the substrate strips to have equal spacing with the current input lines, the current density can further be evenly distributed to enhance uniform current densities among the substrate strips.

DETAIL DESCRIPTION OF THE INVENTION

Please refer to the attached drawings, the present invention is described by means of embodiment(s) below.

Figure 1:
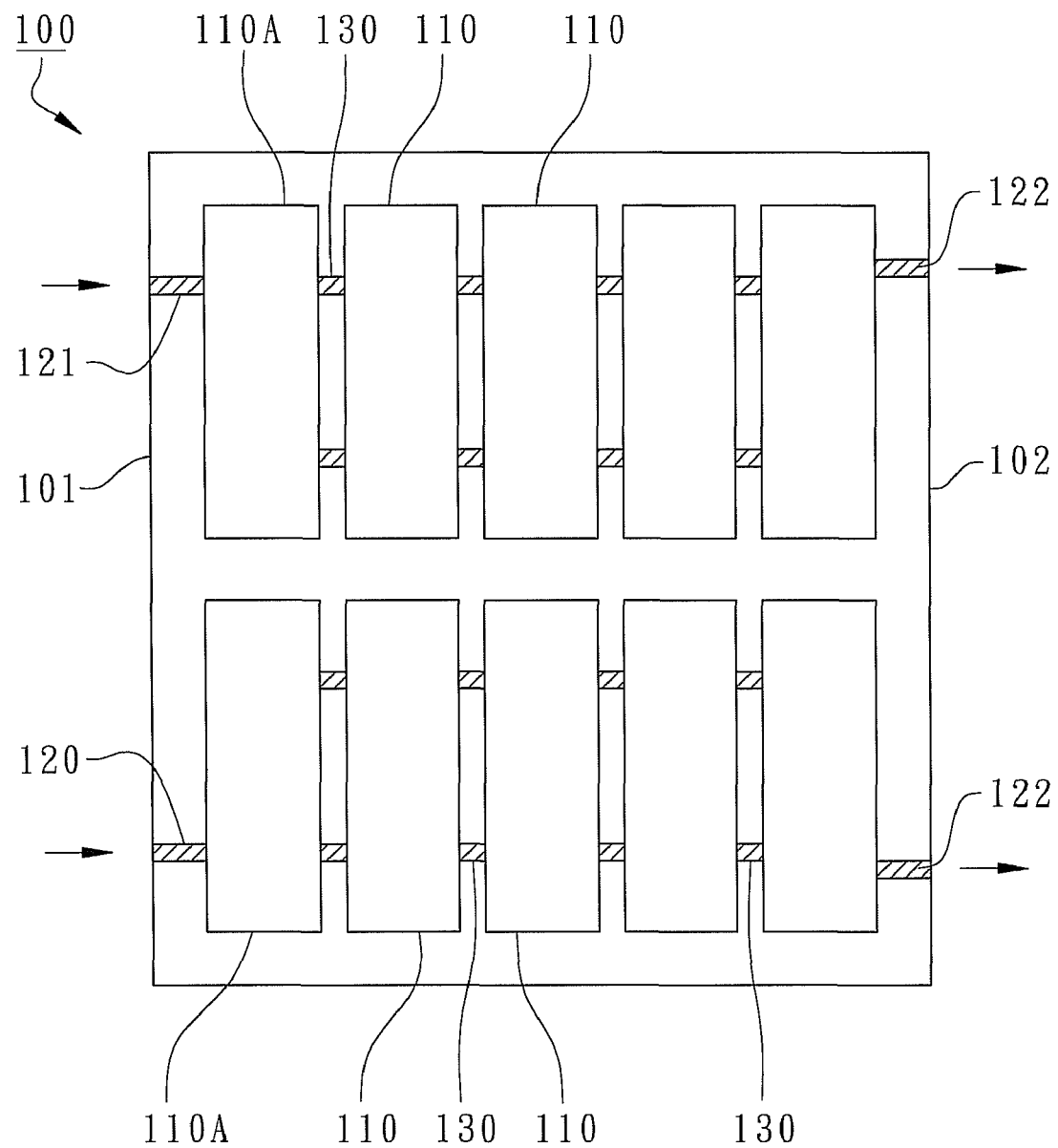
FIG. 1 is a top view of a conventional substrate panel.
Figure 2:
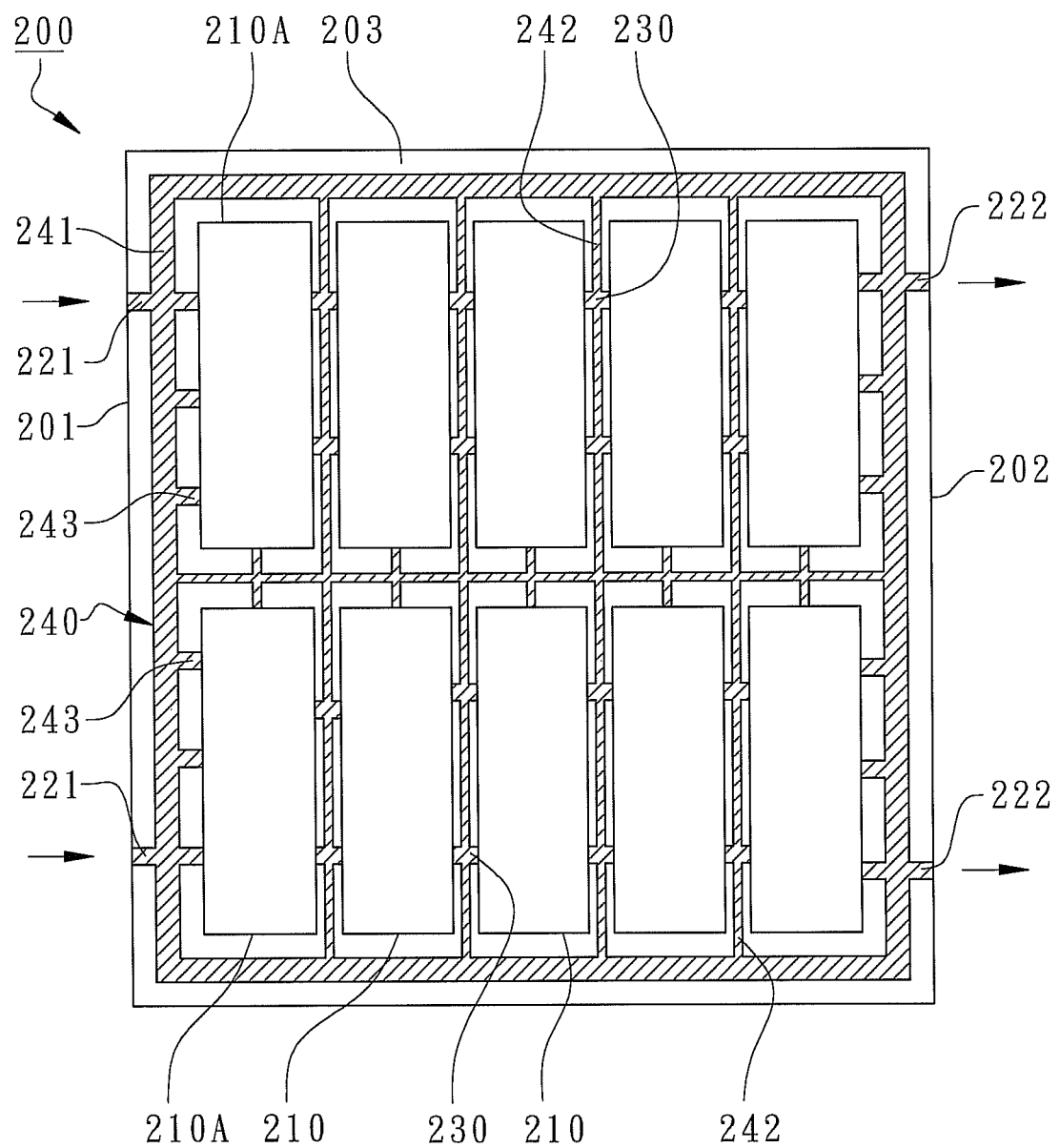
FIG. 2 is a top view of a substrate panel according to the preferred embodiment of the present invention.
Figure 4A:
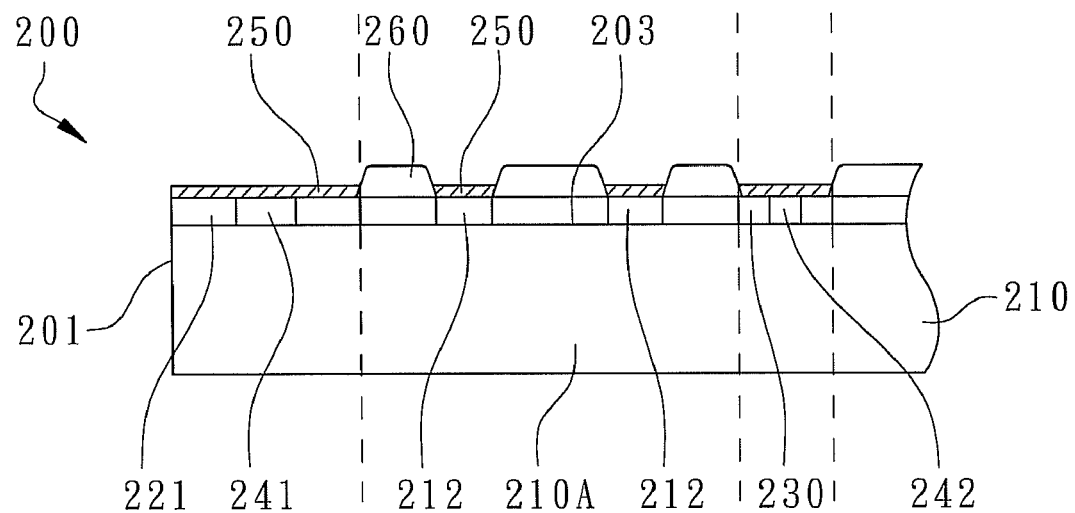
FIG. 4A is a partially cross-sectional view of the substrate panel according to the preferred embodiment of the present invention.

According to the preferred embodiment of the present invention, a substrate panel is illustrated in the top view of FIG. 2 and the partially cross-sectional view of FIG. 4A.

The substrate panel 200 primarily comprises a plurality of substrate strips 210, one or more current input lines 221, a plurality of cascaded lines 230, and a current input buffer gate 240. Normally, the substrate panel 200 is a large-dimension printed circuit board with the length equal to or less than twice of the width such as 1:1, 4:3, or 16:10.

Figure 3:
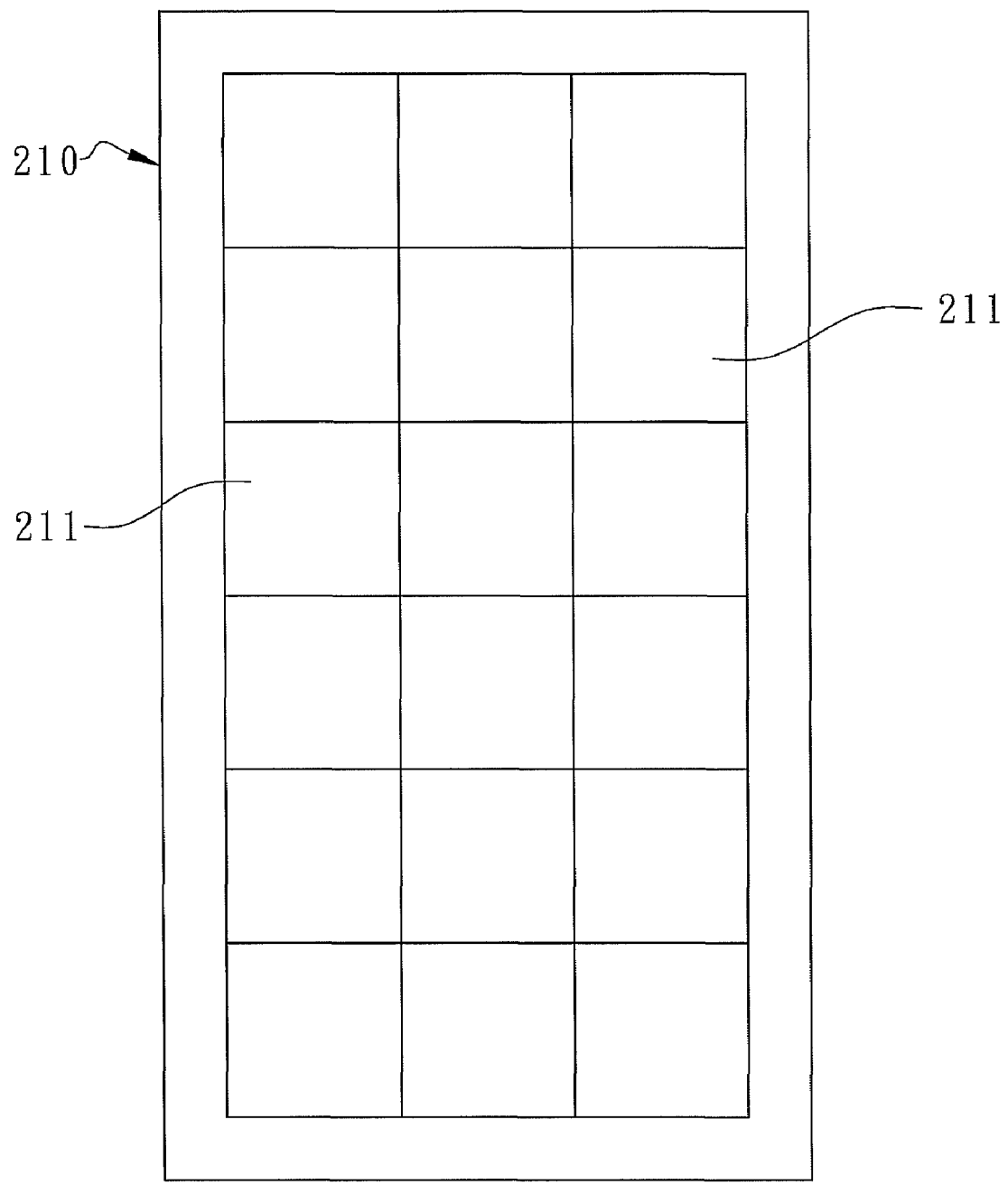
FIG. 3 is a top view of one of the substrate strips from the substrate panel according to the preferred embodiment of the present invention.

The substrate strips 210 are integrally connected in the substrate panel 200 and are arranged in an array. The integral connection means that all of the substrate strips 210 share a same core layer and circuit layer(s) of the substrate panel 200. As shown in FIG. 3, each substrate strip 210 includes a plurality of substrate units 211 arranged in an array. Each substrate unit 211 can be a chip carrier adapted for mounting semiconductor chip(s) for a semiconductor package where a plurality metal pads 212 are waiting for final metal finishes, as shown in FIG. 4A. After singulation of the substrate strips 210, each separated substrate strip 210 will go through semiconductor packaging processes as a conveying unit. After finishing all the semiconductor packaging processes, the substrate units 211 in the substrate strip 210 will be further singulated to formed individual semiconductor packages or chip assemblies. Furthermore, the substrate panel 200 has a current input side 201 and an opposing current output side 202. Normally, the current input side 201 and current output side 202 are correspondingly parallel to each other. Some of the substrate strips 210 adjacent to the current input side 201 are specially numbered as 210A.

The current input lines 221 connect from the current input side 201 to the adjacent substrate strips 210A. In this embodiment, the substrate panel 200 further comprises one or more current output lines 222 connecting from the current output side 202 to some of the substrate strips 210. The cascaded lines 230 connect between the substrate strips 210 to allow current passing through the substrate strips 210 during plating processes. To be more specific, the cascaded lines 230, the current input lines 221 and the current output lines 222 are made of high conductivity metals such as copper and are-disposed on one surface 203 of the substrate panel 200 as shown in FIG. 4A.

The current input buffer gate 240 is disposed on the substrate panel 200 except the substrate strips 210. The current input buffer gate 240 has a frame 241 and a plurality of meshes 242. In the present embodiment, as shown in FIG. 2, the line width of the frame 241 are larger than the one or more current input lines 221 and may further larger than the one of the meshes 242. The meshes 242 are formed inside the frame 241 to form a plurality of nets. Preferably, each net is corresponding to each substrate strip 210 where one opening of the net is slightly larger than the one of the substrate strip 210 to form a conductive ring for electrical protection.

The frame 241 is formed on the peripheries of the surface 203 of the substrate panel 200 and intersects with the current input lines 221. The meshes 242 are formed inside the frame 241 and are located between the substrate strips 210 where the meshes 242 intersect with the cascaded lines 230 with both ends of the meshes 242 connected to the frame 241. As shown in FIG. 4A, since the current input lines 221, the cascaded lines 230, the frame 241, and the meshes 242 are all located on the same surface 203 of the substrate panel, they all can be formed on the same circuit layer to reduce the manufacturing cost. In the present embodiment, the frame 241 is made of copper and is formed in the shape of a rectangle such as a metal frame consisting of a plurality of conductive lines with a same width where the line width of the conductive lines of the frame 241 can be adjusted according to the requirements. In the present embodiment, the materials of the meshes 242 are the same as the frame 241. The connections between both ends of the meshes 242 and the frame 241 are in the shape of "T". Preferably, the frame 241 further intersects with the current output lines 222 to provide a by-pass system.

Furthermore, as shown in FIG. 2, the frame 241 and the current input lines 221 are perpendicularly intersected to form a plurality of right angles. As shown in FIG. 2 again, the frame 241 can equally divide the current input lines 221, i.e., the length of one portion of the current input lines 221 from the frame 241 to the substrate strips 210A is equal to the one of another portion of the current input lines 221 from the frame 241 to the current input side 201 of the substrate panel 200. Furthermore, the length of the current output lines 222 from the frame 241 to the substrate strips 210 may also be equal to the one of the current output lines 222 from the frame 241 to the current output side 202 of the substrate panel 200. In the present embodiment, as shown in FIG. 2, the meshes 242 and the cascaded lines 230 are perpendicularly intersected. In the present embodiment, as shown in FIG.2, the meshes 242 can equally divide the cascaded lines 230, i.e., the lengths of two portions of the cascaded lines 230 located at two corresponding sides of the meshes 242 are equal to achieve evenly distributing the plating current. Preferably, as shown in FIG. 2, the current input buffer gate 240 further has a plurality of plating distributing lines 243 to connect the frame 241 to the adjacent substrate strips 210A to enhance the uniformity of the current distribution. The plating distributing lines 243 may not connect to current input side 201 of the substrate panel 200. The plating distributing lines 243 and the current input lines 221 are parallelly disposed at a same side of the substrate strips 210A with equal spacing to achieve better input current distributions. Preferably, more current plating distributing lines 243 and the current output lines 222 are parallelly disposed so that all of current plating distributing lines 243 are arranged only adjacent to the current input side 201 and the current output side 202. The side rails of the substrate panel 200 between the sides 201 and 202 has no plating distributing lines connecting from the frame 241 to the near row of the substrate strips 210A so that the current distributed in the frame 241 will flow to farther rows of the substrate strips 210 through the meshes 242 instead of the near row of the substrate strips 210A where high current densities are easily accumulated. Hence, the frame 241 can provide better current buffers and reduce the edge effects.

Figure 4B:
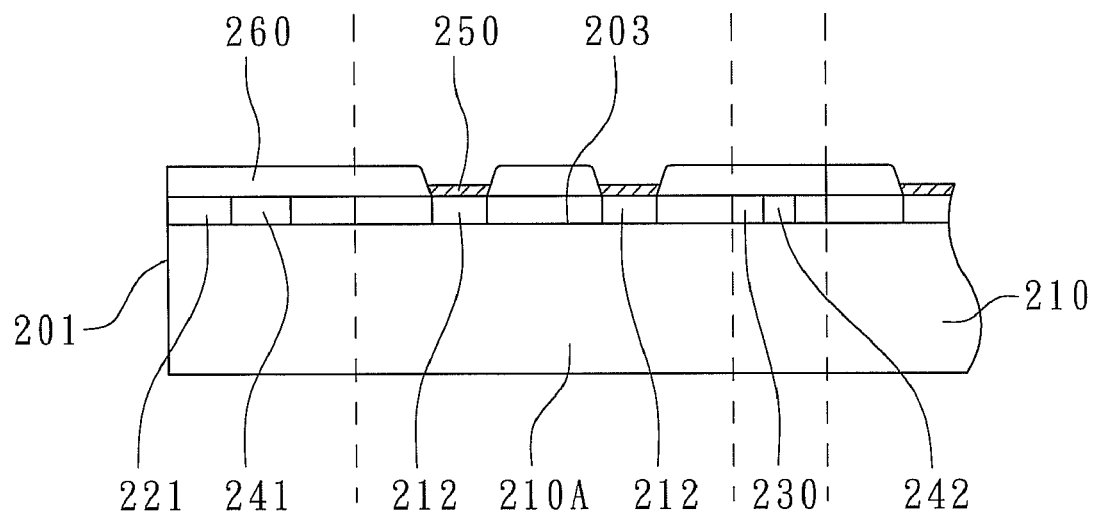
FIG. 4B is a partially cross-sectional view of another substrate panel according to the preferred embodiment of the present invention.

Preferably, as shown in FIG. 4A, the substrate panel 200 further has a plating layer 250 such as Ni/Au formed on the frame 241 by electroplating, i.e., the frame 241 is not covered by solder masks 260. In the present embodiment, a plating layers 250 can further be formed on the frame 241. During electroplating processes, the plating layer 250 will be formed on the metal pads 212 of the substrate strips 210A as well as formed on the frame 241 and the meshes 242. Therefore, the exposed frame 241 can reduce the plating edge effect to have better plating qualities of the substrate strips 110. As shown in FIG. 4B, another substrate panel is revealed, further comprising a solder mask 260 formed on the surface 203 of the substrate panel 200 to cover the frame 241 and the meshes 242 so that the plating layer 250 can effectively form on the metal pads 212 of the substrate strips 210A and 210 to reduce the waste of plating materials leading to lower plating cost.

When current flows from the current input lines 221 to the near row of the substrate strips 210A, the current also is distributed at the frame 241 and then flows to the farther rows of the substrate strips 210 through the meshes 242 and the cascaded lines 230 so that the current density will not concentrate at the near row of the substrate strips 210A by current distribution of the meshes 242 connecting the frame 241. Through the meshes 242, the current further flows to the cascaded lines 230 to evenly distribute the current to each substrate strip 210. Hence, the current can be evenly distributed by the frame 241 and the meshes 242 to avoid higher current densities concentrating at the substrate strips 210A adjacent to the current input side 201 of the substrate panel 200. Therefore, through the current input buffer gate 240 consisting of the frame 241 and the meshes 242, the current can be evenly distributed to each substrate strip 210 to avoid the issues of different plating thicknesses and different plating roughness due to different current densities so that the plating thicknesses on the substrate strips 210A are reduced to be the same as the ones on the rest of the substrate strips 210.

Moreover, once there is a current surge flowing from the current input lines 221, the current surge can be distributed in the frame 241 and the meshes 242 and then flow to the current output lines 222 as a by-pass system to protect the internal circuits inside the substrate strips 110 from damaging by the current surges and the unstable voltages.

Furthermore, the current density can further be evenly distributed through the arrangement of the plating distributing lines 243 and the current input lines 221 equal-spacingly disposed on the same side of the substrate strips 210A so that the current can evenly distribute through the frame 241 to the plating distributing lines 243 and the current input lines 221, then to the substrate strips 210A by multiple entrances to avoid current density concentrated at the corners of the substrate strips 110A.

The above description of embodiments of this invention is intended to be illustrative but not limiting. Other embodiments of this invention will be obvious to those skilled in the art in view of the above disclosure.

What is claimed is:

1. A substrate panel primarily comprising:
   a plurality of substrate strips integrally connected in the substrate panel and arranged in an array, each substrate strip including a plurality of substrate units arranged in an array;
   one or more current input lines connecting from one side of the substrate panel to the adjacent substrate strips;
   a plurality of cascaded lines connecting between the substrate strips; and
   a current input buffer gate disposed on the substrate panel except the substrate strips, the gate having a frame and a plurality of meshes wherein the frame is formed on the peripheries of one surface of the substrate panel and intersects with the current input lines; wherein the meshes are formed inside the frame and located between the substrate strips; wherein the meshes intersect with the cascaded lines with both ends of the meshes connected to the frame.

2. The substrate panel as claimed in claim 1, where the frame and the current input lines are intersected to be perpendicular to each other.

3. The substrate panel as claimed in claim 1, wherein the frame equally divides the current input lines.

4. The substrate panel as claimed in claim 1, wherein the meshes and the cascaded lines are intersected to be perpendicular to each other.

5. The substrate panel as claimed in claim 1, wherein the meshes equally divide the cascaded lines.

6. The substrate panel as claimed in claim 1, wherein the current input buffer gate further has a plurality of plating distributing lines connecting the frame to the adjacent substrate strips.

7. The substrate panel as claimed in claim 6, wherein the plating distributing lines and the current input lines are parallelly disposed at a same side of the adjacent substrate strips with equal spacing.

8. The substrate panel as claimed in claim 7, wherein the plating distributing lines are disposed adjacent to but not connecting with the current input side.

9. The substrate panel as claimed in claim 1, wherein the side of the substrate panel connected by the current input lines is a current input side, wherein the substrate panel further has a current output side parallel and opposite to the current input side, the substrate panel further comprising one or more current output lines connecting from the current output side of the substrate panel to the adjacent substrate strips, wherein the frame further intersects with the current output lines.

10. The substrate panel as claimed in claim 9, wherein the current input buffer gate further has a plurality of plating distributing lines connecting the frame to the adjacent substrate strips, wherein some of the plating distributing lines and the current input lines are parallelly disposed at a same side of the adjacent substrate strips with equal spacing, the rest of the plating distributing lines and the current output lines are parallelly disposed so that all of the plating distributing lines are arranged only adjacent to the current input side and the current output side.

11. The substrate panel as claimed in claim 1, wherein the line width of the frame is larger than the one or more current input lines.

12. The substrate panel as claimed in claim 1, further comprising a plating layer formed on the frame by electroplating.

13. The substrate panel as claimed in claim 12, wherein the plating layer is further formed on the meshes.

14. The substrate panel as claimed in claim 1, further comprising a solder mask formed on the surface of the substrate panel to cover the frame and the meshes.

* * * * *